(12) United States Patent
Zhang

(10) Patent No.: US 6,828,580 B2
(45) Date of Patent: Dec. 7, 2004

(54) VERTICAL FIELD EFFECT TRANSISTORS INCLUDING CONFORMAL MONOCRYSTALLINE SILICON LAYER ON TRENCH SIDEWALL

(75) Inventor: Zhibo Zhang, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 10/677,350

(22) Filed: Oct. 2, 2003

(65) Prior Publication Data

US 2004/0070007 A1 Apr. 15, 2004

Related U.S. Application Data

(62) Division of application No. 10/007,895, filed on Nov. 6, 2001, now Pat. No. 6,664,143.
(60) Provisional application No. 60/252,306, filed on Nov. 22, 2000.

(51) Int. Cl.[7] .......................................... H01L 31/0328
(52) U.S. Cl. .................... 257/24; 257/200; 257/256; 257/329
(58) Field of Search ........................ 257/24, 200, 256, 257/329, 266, 331; 438/156, 268, 269

(56) References Cited

U.S. PATENT DOCUMENTS

| | | | | |
|---|---|---|---|---|
| 4,903,089 A | * | 2/1990 | Hollis et al. ................. | 257/256 |
| 5,106,778 A | * | 4/1992 | Hollis et al. ................. | 438/173 |
| 5,612,563 A | * | 3/1997 | Fitch et al. .................. | 257/329 |
| 5,739,057 A | | 4/1998 | Tiwari et al. ................. | 438/172 |
| 5,757,038 A | | 5/1998 | Tiwari et al. ................. | 257/192 |
| 6,027,975 A | * | 2/2000 | Hergenrother et al. ....... | 438/268 |
| 6,049,106 A | | 4/2000 | Forbes ........................ | 257/329 |
| 6,420,751 B1 | | 7/2002 | Maeda et al. ................. | 257/302 |

FOREIGN PATENT DOCUMENTS

EP    0 989 599 B1    6/2003

OTHER PUBLICATIONS

Yeo et al., *Nanoscale Ultra–Thin–Body Silicon–on–Insulator P–Mosfet With a SiGe/Si Heterostructure Channel*, IEEE Electron Device Letters, vol. 21, No. 4, Apr. 2000, pp. 161–163.

*International Technology Roadmap for Semiconductors*, 1999 Edition.

Lee et al., *Super Self–Aligned Double–Gate (SSDG) MOSFETs Utilizing Oxidation Rate Difference and Selective Epitaxy*, International Electron Devices Meeting, 1999, pp. 71–74.

Hergenrother et al., *The Vertical Replacement–Gate (VRG) MOSFET: A 50–nm Vertical MOSFET With Lithography–Independent Gate Length*, International Electron Devices Meeting, 1999, pp. 75–78.

Yang et al., *25–nm p–Channel Vertical MOSFET's With SiGeC Source–Drains*, IEEE Electron Device Letters, vol. 20, No. 6, Jun. 1999, pp. 301–303.

(List continued on next page.)

*Primary Examiner*—David Nelms
*Assistant Examiner*—Dao H. Nguyen
(74) *Attorney, Agent, or Firm*—Myers Bigel Sibley & Sajovec

(57) ABSTRACT

A vertical field effect transistor includes a microelectronic substrate having a trench, the trench defining a sidewall. A conformal monocrystalline silicon layer is provided on the sidewall, including a drain region adjacent the substrate, a source region remote from the substrate, and a channel region between the source and drain regions. A plug is provided in the trench. A gate insulating layer is provided adjacent the channel and a gate electrode is provided on the gate insulating layer.

7 Claims, 3 Drawing Sheets

OTHER PUBLICATIONS

Subramanian et al., *Low–Leakage Germanium–Seeded Laterally–Crystallized Single–Gran 100–nm TFT's for Vertical Integration Applications*, IEEE Electron Device Letters, vol. 20, No. 7, Jul. 1999, pp. 341–343.

Choi et al., *Ultra–Thin Body SOI MOSFET for Deep–Sub–Tenth Micro Era*, International Electron Devices Meeting, 1999, pp. 919–921.

Wong, *Vertical Slab*, IEDM Short Course, 1999, p. 30.

Jin et al., *Nickel Induced Crystallization of Amorphous Silicon Thin Films*, Journal of Applied Physics, vol. 84, No. 1, Jul. 1, 1998, pp. 194–200.

Hisamoto et al., *A Folded–Channel MOSFET for Deep–Sub Tenth Micron Era*, International Electron Devices Meeting, 1998, pp. 1032–1034.

Wong et al., *Device Design Considerations for Double–Gate, Ground–Plane, and Single–Gated Ultra–Thin SOI MOSFET's at the 25 nm Channel Length Generation*, International Electron Devices Meeting, 1998, pp. 407–410.

Yu et al., *"Ultra–Thin–Body Silicon–on–Insulator MOSFET's for Terabit–Scale Integration"*; 1997 International Semiconductor Device Research Symposium, University of Virginia, Charlottesville, VA, Dec. 11–13, 1997, p. 623.

Leobandung et al., *Wire–Channel and Wrap–Around–Gate Metal–Oxide–Semiconductor Field–Effect Transistors With a Significant Reduction of Short Channel Effects*, J. Vac. Sci. Technol. B, vol. 5, No. 6, Nov./Dec. 1997, pp. 2791–2794.

Taur et al., *CMOS Scaling into the Nanometer Regime*, Proceedings of the IEEE, vol. 85, No. 4, Apr. 1997, pp. 486–504.

Auth et al., *Scaling Theory for Cylindrical Fully–Depleted, Surrounding–Gate MOSFET's*, IEEE Electron Device Letters, vol. 18, No. 2, Feb. 1997, pp. 74–76.

Risch et al., *Vertical MOS Transistors With 70 nm Channel Length*, IEEE Transactions on Electron Devices, vol. 43, No. 9, Sep. 1996, pp. 1495–1498.

Wann et al., *A Comparative Study of Advanced MOSFET Concepts*, IEEE Transactions on Electron Devices, vol. 43, No. 10, Oct. 1996, pp. 1742–1753.

Tanaka et al., *Ultrafast Operation of $V_{th}$–Adjusted $p^+$–$n^+$ Double–Gate SOI MOSFET's*, IEEE Electron Device Letters, vol. 15, No. 10, Oct. 1994, pp. 386–388.

Colinge et al., *Silicon–on–Insulator "Gate–All–Around Device"*, International Electron Devices Meeting, 1990, pp. 595–598.

Takato et al., *High Performance CMOS Surrounding Gate Transistor (SGT) for Ultra High Density LSIs*, International Electron Devices Meeting, 1988, pp. 222–225.

* cited by examiner

VERTICAL FIELD EFFECT TRANSISTORS INCLUDING CONFORMAL MONOCRYSTALLINE SILICON LAYER ON TRENCH SIDEWALL

CROSS-REFERENCE TO RELATED APPLICATIONS

This application is a divisional application of application Ser. No. 10/007,895, filed Nov. 6, 2001, entitled Methods of Fabricating Vertical Field Effect Transistors by Conformal Channel Layer Deposition (now U.S. Pat. No. 6,664,143), and claims the benefit of provisional Application No. 60/252,306, filed Nov. 22, 2000, entitled Methods of Fabricating Vertical Field Effect Transistors by Conformal Channel Layer Deposition on Sidewalls and Vertical Field Effect Transistors Fabricated Thereby, both of which are assigned to the assignee of the present application, the disclosures of which are hereby incorporated herein by reference in their entirety as if set forth fully herein.

BACKGROUND OF THE INVENTION

This invention relates to microelectronic devices and fabrication methods therefor, and more particularly to microelectronic vertical field effect transistors and fabrication methods therefor.

Field Effect Transistors (FET), also referred to as Metal Oxide Semiconductor Field Effect Transistors (MOSFET) or Complementary Metal Oxide Semiconductor (CMOS) transistors, are widely used in integrated circuit devices including logic, memory and/or microprocessor devices that are used in consumer and/or industrial applications. As the integration density of integrated circuit field effect transistors continues to increase, it may be desirable to continue to shrink the dimensions of the field effect transistors. For example, present day FETs may be fabricated with a minimum device feature size of about 0.18 to about 0.25 $\mu$m. However, The International Roadmap for Semiconductors, published by International SEMATECH at http://www.itrs.net/1999_SIA_Roadmap/Home.htm, predicts that the minimum gate length will reach 35 nm in 10–15 years.

Conventionally, features of integrated circuit FETs may be formed on a microelectronic substrate, such as silicon semiconductor substrate, using photolithography and etching. Unfortunately, as the minimum feature size scales into the sub-0.1 $\mu$m region, it may be increasingly difficult to define such small features using traditional lithography and etching. Although improved nano-lithography techniques may be developed, it still may be difficult to reliably define features as small as 35 nm or smaller in a controllable and cost-effective way using lithography, to allow mass production. Moreover, from a device physics point of view, as the dimensions of FETs continues to shrink, the suppression of short channel effects may become increasingly difficult.

In attempts to reduce short channel effects, planar fully depleted ultra-thin body Semiconductor-On-Insulator (SOI) FETs have been developed. For example, using a semiconductor-on-insulator substrate and etchback or oxide thinning, ultra-thin SOI channels may be obtained. See, for example, Choi et al., *Ultra-Thin Body SO MOSFET for Deep-Sub-Tenth Micron Era*, Paper 3.7.1, IEDM, 1999, pp. 919–921. Other approaches have deposited a thin layer of amorphous silicon or silicon germanium alloy on a planar oxide surface, followed by lateral solid-state crystallization. See, Yeo et al., *Nanoscale Ultra-Thin-Body Silicon-On-Insulator P-MOSFET with a SiGe/Si Heterostructure Channel*, IEEE Electron Device Letters, Vol. 21, No. 4, 2000, pp. 161–163. Unfortunately, although planar fully depleted ultra-thin body devices may be capable of reducing short channel effects, it may be difficult to further increase the integration density and/or performance of these devices, because the gate may still be defined by lithography.

Double gate and/or surround gate FETs also have been proposed to reduce short channel effects. A double/surround gate FET may include a thin channel that is controlled by both a front gate and a back gate. Short channel effects may be suppressed because the two gates can be effective in terminating drain field lines and preventing the drain potential from impacting the source. Double gate devices may be extended to provide surround gate devices in which the gate wraps around the channel. As shown by computer simulations, in order to effectively suppress the short channel effects in a double gate MOSFET, the channel thickness may need to be as thin as one-half to one-third of the gate length. See, for example, Wong et al., *Device Design Considerations for Double-Gate, Ground-plane, and Single-Gated Ultra-Thin SOI MOSFET's at the 25 nm Channel Length Generation*, IEDM, 1998, pp. 407–410.

FETs including double/surround gate FETs may be grouped into two categories based on the channel orientation. In horizontal devices, carrier conduction from source to drain through the channel occurs in a direction that is generally parallel to the face of the microelectronic substrate. In contrast, in vertical devices, carrier conduction from source to drain through the channel occurs in the vertical direction, generally orthogonal to the face of the microelectronic substrate.

In horizontal approaches for fabricating double/surround gate FETs, the gate length may be defined by lithography, and the formation of a back gate beneath the thin channel and its accurate alignment to the top gate may present challenges. See, for example, the publications to Tanaka et al., entitled *Ultrafast Operation of $V_{th}$-Adjusted p+-n+ Double-Gate SOI MOSFETs*, IEEE Electron Device Letters. Vol. 15, No. 10, October 1994, pp. 386–388; Colinge et al., entitled *Silicon-on-Insulator "Gate-All-Around Device"*, IEDM, 1990, pp. 595–598; Leobandung et al., entitled *Wire-Channel and Wrap-Around-Gate Metal-Oxide-Semiconductor Field-Effect Transistors With a Significant Reduction of Short Channel Effects*, Journal of Vacuum Science Technology B, 15(6), November/December 1997, pp. 2791–2794; Hisanoto et al., entitled *A Folded-Channel MOSFET for Deep-sub-tenth Micron Era*, IEDM, 1998, pp. 1032–1034; and Lee et al., entitled *Super Self-Aligned Double-Gate (SSDG) MOSFETs Utilizing Oxidation Rate Difference and Selective Epitaxy*, IEDM, 1999, pp. 71–74.

In contrast, in vertical devices, the fabrication of the double/surround gate structures may be more straightforward because both the front and back gates can be formed simultaneously. Vertical FETs also may be fabricated with a higher integration density, because carrier conduction occurs orthogonal to the substrate face. See, Takato et al., entitled *High Performance CMOS Surrounding Gate Transistor (SGT) for Ultra High Density LSIs*, IEDM, 1988, pp. 222–225; Risch et al., entitled *Vertical MOS Transistors With 70 nm Channel Length*, IEEE Transactions on Electron Devices, Vol. 43, No. 9, September 1996, pp. 1495–1498; Auth et al., entitled *Scaling Theory for Cylindrical, Fully-Depleted, Surrounding-Gate MOSFET's*, IEEE Electron Device Letters, Vol. 18, No. 2, February 1997, pp. 74–76; and Yang et al., entitled *25-nm p-Channel Vertical MOSFET's With SiGeC Source-Drains*, IEEE Electron Device Letters, Vol. 20, No. 6, June 1999, pp. 301–303. In vertical devices, the gate length is usually defined by thin-film deposition. However, the lithography actually may be more difficult, because the channel thickness, which may be about one-third of the gate length, generally is lithography-dependent.

A vertical replacement gate MOSFET also is described in a publication by Hergenrother et al., entitled *The Vertical Replacement-Gate (VRG) MOSFET: A 50 nm Vertical MOSFET With Lithography-Independent Gate Length*, IEDM, 1999, p. 75, the disclosure of which is hereby incorporated herein by reference in its entirety. As described in the abstract of Hergenrother et al., the VRG MOSFET is the first MOSFET ever built that combines 1) a gate length controlled precisely through a deposited film thickness, independently of lithography and etch, and 2) a high-quality gate oxide grown on a single-crystal Si channel. In addition to this unique combination, the VRG-MOSFET includes a self-aligned S/D formed by solid source diffusion (SSD) and small parasitic overlap, junction, and S/D capacitances. The drive current per $\mu$m of coded width is significantly higher than that of advanced planar MOSFETs because each rectangular device pillar (with a thickness of minimum lithographic dimension) contains two MOSFETs driving in parallel. All of this is achieved using current manufacturing methods, materials, and tools, and competitive devices with 50-nm gate lengths ($L_G$) having been demonstrated without advanced lithography. See the Hergenrother et al. abstract.

As also described in the "Device Fabrication" section of Hergenrother et al., in the VRG process, arsenic was implanted into an epi Si wafer to form the device drain and a thin oxide diffusion barrier was deposited. A PSG/nitride/undoped oxide/nitride/PSG/nitride stack was deposited and a trench (or window) with nearly vertical sidewalls was etched through the entire stack. The boron-doped epitaxial Si device channel was grown selectively in this trench and the channel was planarized to the top nitride layer by CMP. The undoped oxide film in the stack was a sacrificial layer whose thickness was defined as $L_G$, the two phosphosilicate glass (PSG) layers were dopant sources used to form low-resistance, shallow, self-aligned S/D extension by SSD of phosphorus, and the thin nitride layers between the undoped oxide and the dopant sources functioned as etch stops and as precision offset spacers. A polysilicon source landing pad was deposited, implanted with arsenic, and patterned. After this landing pad and the top PSG dopant source had been encased in nitride via spacer formation, the sacrificial oxide layer was removed selectively to expose the vertical Si channel. A thin gate oxide was grown on the channel, and a phosphorous-doped, highly conformal a-Si gate was deposited and recrystallized. See Hergenrother et al. Page 3.6.1, Column 2.

SUMMARY OF THE INVENTION

Vertical field effect transistors may be fabricated, according to embodiments of the present invention by depositing a vertical channel on a microelectronic substrate at a thickness along the microelectronic substrate that is independent of lithography, the vertical channel extending orthogonal to the microelectronic substrate. Source and drain regions are formed at respective opposite ends of the vertical channel, and an insulated gate is formed adjacent the vertical channel.

By depositing a vertical channel that has a thickness that is independent of lithography, vertical field effect transistors according to embodiments of the invention may be scaled down independent of advances in photolithography. Moreover, the insulated gate may be formed by forming an insulated gate on the vertical channel, the insulated gate extending orthogonal to the microelectronic substrate and having a length along the channel that is independent of lithography, for example using vertical replacement gate formation techniques. Accordingly, both the channel thickness and the gate length of the FET may be controlled independent of lithography. Accordingly, relief from the technical barriers that may prevent the extension of fabrication technologies to their ultimate limit may be provided.

Other methods of fabricating vertical field effect transistors according to embodiments of the present invention, line a sidewall of a trench on a microelectronic substrate with a conformal silicon layer. The conformal silicon layer on the sidewall of the trench includes a first end portion adjacent the substrate, a second end portion remote from the substrate, and a middle portion between the first and second end portions. The first and second end portions are doped to form source and drain regions for the field effect transistor. A gate insulating layer is formed adjacent the middle portion and a gate electrode is formed on the gate insulating layer opposite the middle portion. Lining the sidewall of the trench may be performed by lining the sidewall of the trench with amorphous silicon and then crystallizing the amorphous silicon. After lining the sidewall, the trench that is lined may be plugged, using silicon dioxide, high dielectric constant dielectrics and/or other materials. In some embodiments, the entire sidewall of the trench may be lined with the conformal silicon layer, to provide a continuous conformal silicon layer. In other embodiments, spaced apart portions of the trench sidewall are lined to provide spaced apart conformal silicon plates.

In still other embodiments of the present invention, prior to lining the sidewall of the trench, a first doping layer is formed on the substrate, an intermediate layer is formed on the first doping layer opposite the substrate, and a second doping layer is formed on the intermediate layer opposite the first doping layer. The trench is defined in the first doping layer, the intermediate layer and the second doping layer. When lining the sidewall of the trench with the conformal silicon layer, the first end portion is adjacent the first doping layer, the second end portion is adjacent the second doping layer, and the middle portion is adjacent the intermediate layer. The first and second end portions are doped with dopants from the respective first and second doping layers adjacent thereto, to form the source and drain (or source/drain extension) regions for the field effect transistor. The doping layers may be any layers that can supply dopants to silicon. For example, doped and/or undoped phosphosilicate glass (PSG) and/or borosilicate glass (BSG) may be used. The gate insulating layer may be formed by removing the intermediate layer adjacent the middle portion, to expose at least some of the middle portion and forming a gate insulating layer on the middle portion that is exposed. The gate insulating layer may be formed by thermally oxidizing the middle portion that is exposed. The gate insulating layer also can be deposited using a conformal deposition technique, such as a CVD (Chemical Vapor Deposition) process.

Other methods of fabricating vertical field effect transistor according to embodiments of the present invention form a first doping layer on a microelectronic substrate, form an intermediate layer on the first doping layer opposite the substrate and form a second doping layer on the intermediate layer opposite the first doping layer. A trench is then formed in the first doping layer, the intermediate layer and the second doping layer, the trench including a trench sidewall. The trench sidewall is lined with a conformal amorphous silicon layer. The conformal silicon layer on the trench sidewall includes a first end portion adjacent the first doping layer, a second end portion adjacent the second doping layer, and a middle portion between the first and second end portions adjacent the intermediate layer. The amorphous silicon layer is then crystallized. The trench that is lined is plugged, for example, with silicon dioxide, high dielectric constant dielectrics and/or other materials. Annealing is performed to dope the first end portion and the second end portion with dopants from the first and second doping layers respectively. The intermediate layer is removed adjacent the middle portion to expose at least some of the middle portion. A gate insulating layer is formed on the middle portion that is exposed, and a gate electrode is formed on the gate insulating layer, opposite the middle portion. One or more drain contacts may be formed in the microelectronic substrate prior to forming the first doping layer. For example, silicide drain contacts may be formed. Moreover, one or more source contacts may be formed on the second end of the conformal silicon layer.

Vertical field effect transistors according to embodiments of the invention include a microelectronic substrate including a trench, wherein the trench defines a sidewall. A conformal monocrystalline silicon layer is included on the sidewall of the trench. The conformal monocrystalline silicon layer on the sidewall of the trench includes a drain region adjacent the substrate, a source region remote from the substrate, and a channel region between the source and drain regions. A plug is included in the trench that includes the conformal monocrystalline silicon layer on the sidewall thereof. The plug may comprise silicon dioxide, high dielectric constant materials and/or other materials. A gate insulating layer is included adjacent the channel, and a gate electrode is included on the gate insulating layer opposite the channel.

In some device embodiments, the conformal monocrystalline silicon layer on the sidewall of the trench is a continuous conformal monocrystalline silicon layer. In other embodiments, the conformal monocrystalline silicon layer comprises two or more spaced apart conformal portions on the sidewall of the trench.

Other field effect transistors according to embodiments of the invention can include a first layer on the substrate and a second layer on the first layer opposite the substrate. The trench extends in the doped layer and the second layer, and the gate insulating layer and the gate electrode are between the first and second layers. In some embodiments, the first and second layers comprise phosphosilicate glass. Accordingly, field effect transistors that can be scaled to nanoscale dimensions can be provided and can be manufactured using conventional processing steps.

DETAILED DESCRIPTION OF PREFERRED EMBODIMENTS

Figure 1A:
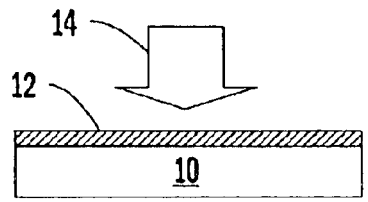
FIGS. 1A–1N are cross-sectional views of methods of fabricating vertical field effect transistors according to embodiments of the invention during intermediate fabrication steps.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Embodiments of the present invention can provide MOSFETs that can have ultra-thin bodies of nanoscale dimensions, wherein the channel thickness may be defined independent of lithography. Other embodiments of the invention also can allow the gate length to be defined independent of photolithography, for example using replacement gate fabrication techniques. By allowing the channel thickness and, optionally, the gate length to be defined independent of lithography, technological barriers for scaling field effect transistor technology to and below 35 nm may be overcome. Moreover, as will be described in detail below, both the gate length and the channel thickness may be defined by thin film deposition processes. As is well known to those having skill in the art, thin film deposition processes are mature and controllable. Accordingly, embodiments of the invention can produce nanoscale devices with gate lengths up to and below 25 nm and with channel thicknesses up to and below 5 nm, while allowing only existing and well-tested technologies to be used in the fabrication. Finally, as will be described below, since the gate insulator and gate electrode can be formed after source/drain formation, high dielectric constant gate dielectrics and/or metal gates may be used.

Figure 1B:
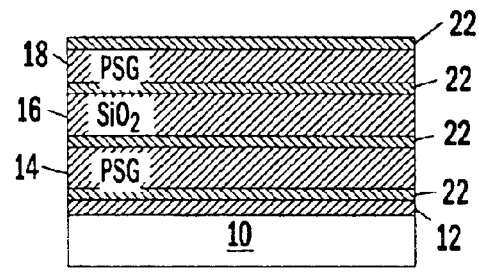
Figure 1C:
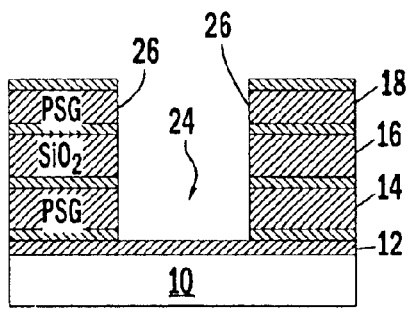
Figure 1D:
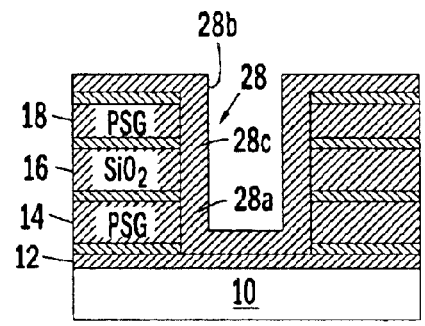
Figure 1E:
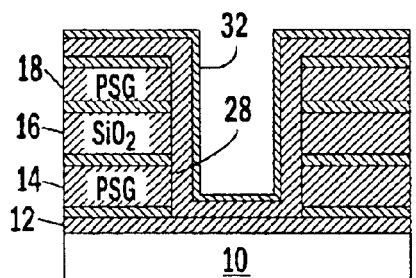
Figure 1F:
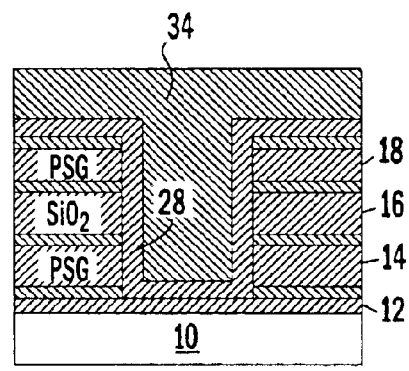
Figure 1G:
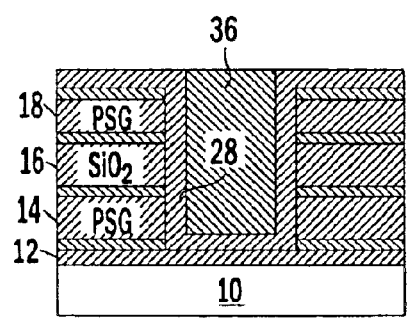
Figure 1H:
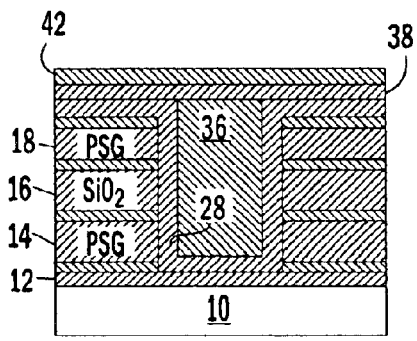
Figure 1I:
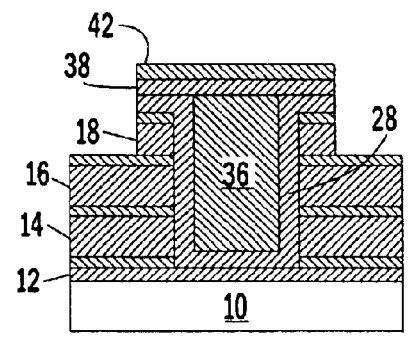
Figure 1J:
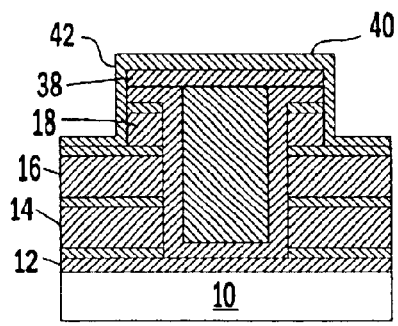
Figure 1K:
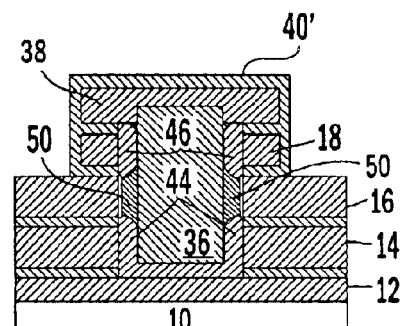
Figure 1L:
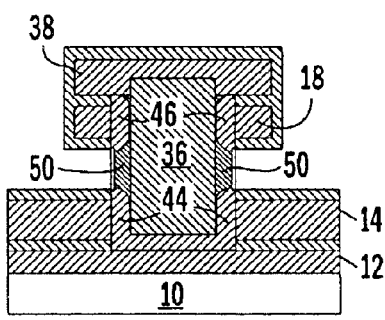
Figure 1M:
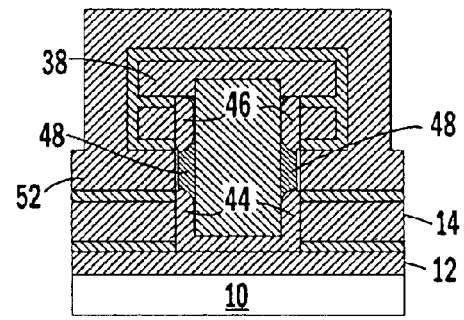
Figure 1N:
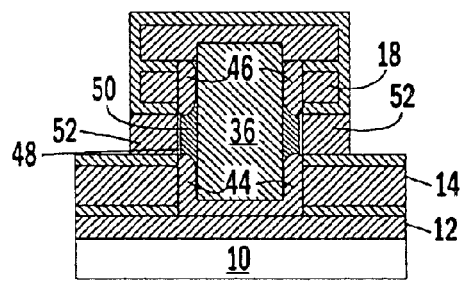

FIGS. 1A–1N are cross-sectional views of methods of fabricating vertical field effect transistors according to embodiments of the present invention during intermediate fabrication steps. Referring now to FIG. 1A, a microelectronic substrate 10 is provided. The substrate 10 may be a monocrystalline silicon substrate, such as a lightly doped p-type silicon substrate. However, the substrate may also be a monocrystalline silicon substrate with an epitaxial silicon layer thereon, or a silicon-on-insulator substrate. Moreover, since transistors according to the present invention may be formed using crystallized silicon layers, the substrate may comprise non-silicon semiconductors, such as gallium arsenide, silicon carbide and/or gallium nitride, or non-semiconductor substrates, such as glass substrates. As shown in FIG. 1A, one or more optional drain contact regions 12 may be defined, for example by blanket or masked implantation of ions 14, such as phosphorus and/or arsenic for an n-type MOSFET, and boron for a p-type MOSFET. It also will be understood that metal and/or metal silicide drain contact regions 12 may be used. Optionally, a protective oxide layer may be formed on the face of the substrate 10, prior to or after implantation. The drain contact(s) 12 also may be defined using epitaxy.

Referring now to FIG. 1B, a three-layer stack then is formed on the substrate 10. In particular, a first doping layer 14, comprising for example undoped and/or doped phosphosilicate glass (PSG) and/or undoped and/or doped borosilicate glass (BSG) is formed on the microelectronic substrate 10. An intermediate layer, comprising for example silicon dioxide (SiO$_2$) 16 is formed on the first doping layer 14 opposite the substrate 10. A second doping layer 18, comprising for example undoped and/or doped PSG and/or BSG, is formed on the intermediate layer 16 opposite the first doping layer 14. Optional silicon nitride (Si$_3$N$_4$) layers 22 may be formed between the substrate 10, the first doping layer 14, the intermediate layer 16, and the second doping layer 18, as shown.

As will be described in detail below, the first and second doping layers 14 and 18 provide a dopant source for the subsequent formation of source and drain regions of the transistor. Accordingly, any other material or combinations of materials that can provide dopant sources may be used for layers 14 and 18. Moreover, if other techniques for doping are used, the first and second layers 14 and 18 need not be doping layers. The optional layers 22 can function as offset spacers. As will be described below, in some embodiments, the intermediate layer 16 is a sacrificial layer that later will be removed to provide a replacement gate. Accordingly, any material that is compatible with the other materials and that is amenable to selective removal may be used. For example, when silicon dioxide is used for the intermediate layer 16, a layer that is thinner than 25 nm can be fabricated using conventional fabrication techniques, while still allowing excellent uniformity control. In replacement gate steps, the intermediate layer 16 can define the gate length, as will be described in detail below.

Referring now to FIG. 1C, a trench 24 is formed in the first doping layer 14, the intermediate layer 16, and the second doping layer 18. The trench may be formed by conventional photolithography and etching, using, for example, the substrate 10 as an etch stop. As will be described below, the width of the trench need not determine the thickness of the channel that is formed subsequently, so that conventional photolithography may be used. The trench also may be formed by selective deposition and removal of a sacrificial plug, liftoff and/or other conventional techniques. The formation of layers 14, 16, 18 of FIG. 1B and the trench formation step of FIG. 1C also are illustrated in the above-cited Hergenrother et al. article, at FIG. 1 and the accompanying text.

Referring now to FIG. 1D, the trench sidewall 26 is lined with a conformal silicon layer 28. The conformal silicon layer 28 on the trench sidewall 26 includes a first end portion 28a adjacent the first doping layer 14, a second end portion 28b adjacent the second doping layer 18, and a middle portion 28c between the first and second end portions adjacent the intermediate layer 16.

In some embodiments, the entire sidewall 26 is lined with the conformal silicon layer 28, to provide a continuous conformal silicon layer. A continuous conformal silicon layer may be used, for example, to provide a wraparound gate for a field effect transistor that is fabricated subsequently, as will be described below. In other embodiments, spaced apart portions of the trench sidewall are lined with silicon, to provide spaced apart conformal silicon plates. Two or more spaced apart conformal silicon plates may be provided. The conformal silicon plates may be connected in parallel to source and drain contacts, to provide field effect transistors that are driven in parallel. Alternatively, the drain contact 12 may be patterned and/or the source contact may be patterned, as will be described below, to provide multiple field effect transistors within the trench 24 that can have a common source connection, a common gate connection and/or common drain connection, and/or can have independent source, drain and/or gate connections.

Still referring to FIG. 1D, the silicon layer 28 preferably is formed by Chemical Vapor Deposition (CVD), which can provide a conformal coverage of the trench 24. Other conformal layer deposition techniques also may be used. The silicon layer 28 can be as thin as several nanometers or less. It will be understood that before deposition of the silicon layer 28, a short, diluted hydrofluoric acid (HF) clean can be used to clear the native oxide on the surface, if desired. A thermal oxidation step may also be performed to thin the silicon layer, if desired. An isotropic and/or anisotropic etch also may be performed to thin the silicon layer, if desired. In any event, the thickness of the silicon layer 28 is independent of lithography.

In some embodiments of the invention, the silicon layer 28 can be a conformal monocrystalline silicon layer. However, it may be difficult to directly deposit monocrystalline silicon in the absence of a seed for epitaxy. It will be understood, however, that a seed may be formed, for example, using the substrate 10 and/or drain contact 12. In other embodiments, the conformal layer of silicon 28 is a non-monocrystalline layer, for example a polysilicon or amorphous silicon layer, which may be deposited using chemical vapor deposition and/or other conformal deposition techniques.

Still referring to FIG. 1D, the non-monocrystalline silicon layer then is crystallized, to form monocrystalline silicon. For example, a low temperature solid-state crystallization process may be carried out, to convert the amorphous silicon into single crystal silicon, which can serve as the vertical silicon channels for the field effect transistors, as will be described below. Crystallization of amorphous silicon and/or polysilicon into monocrystalline silicon is well known to those having skill in the art and is described for example in Yeo et al., *Nanoscale Ultra-Thin-Body Silicon-on-Insulator P-MOSFET with a SiGe/Si Heterostructure Channel*, IEEE Electron Device Letters, Vol. 21, No. 4, April 2000, pp. 161–163; Jin et al., *Nickel Induced Crystallization of Amorphous Silicon Thin Films*, Journal of Applied Physics, Vol. 84, No. 1, Jul. 1, 1998, pp. 194–200; and Subramanian et al., *Low-Leakage Germanium-Seeded Laterally-Crystallized Single-Grain 100-nm TFT's for Vertical Integration Applications*, IEEE Electron Device Letters, Vol. 20, No. 7, July 1999, pp. 341–343. Accordingly, crystallization need not be described in detail herein. It also will be understood that crystallization may occur at later points in fabrication, after any of the other fabrication steps that will be described below.

Referring now to FIGS. 1E–1G, the trench that is lined with the conformal silicon layer 28 is then plugged. For example, as shown in FIG. 1E, thermal oxidation is performed, to form an optional thermal oxide layer 32 on the conformal silicon layer 28. The thermal oxide layer 32 can provide a high quality back oxide for the ultra-thin body transistor. In other embodiments, the thermal oxide layer 32 may be removed, and the conformal silicon layer 28 may be thermally oxidized again, to allow even higher quality back oxides to be produced. Then, referring to FIG. 1F, an insulating layer such as silicon dioxide may be formed in the trench 24 and on the silicon layer 28 outside the trench 24, for example using chemical vapor deposition. In still other embodiments, the back oxide can comprise a high dielectric constant (high-k) dielectric, such as ferroelectric materials, for example SrTiO$_3$ and/or BaSrTiO$_3$. Then, as shown in FIG. 1G, the oxide layer 34 is planarized, for example using chemical-mechanical polishing (CMP) to provide a plug 36 in the trench 24. It will be understood that the CMP process may be performed until the silicon layer 28 is exposed.

Alternatively, a blanket oxide etch can be performed to remove excess oxide until the silicon layer 28 is exposed. It also will be understood that many other materials may be used for the plug 36, including other insulating materials and combinations of insulating materials with conductive materials.

Referring now to FIG. 1H, an optional source contact layer 38, for example polysilicon may be deposited and doped in situ or implanted, for example with phosphorus and/or arsenic for an n-MOSFET and boron for a p-MOSFET, to form a source contact. A masking layer, such as a silicon nitride masking layer 42 then is formed on the source contact layer 38. A source pad then is patterned, as shown in FIG. 1I, for example by etching, with the etch stopping on the nitride layer 22 between the intermediate layer 16 and the second doping layer 18. As was described above, multiple source contact layer portions also may be provided.

Referring now to FIG. 1J, another masking layer 40, such as a silicon nitride masking layer, may be conformally deposited, for example using chemical vapor deposition, and may be etched, for example using a directional etch, such as a plasma etch. Thus, as shown in FIG. 1K, portions of the second masking layer 40' remain on the source contact region 38, on the sidewall of the source contact region 38, and on the sidewall of the patterned second doping layer 18, but the intermediate layer 16 is exposed. An anneal also is performed, for example using rapid thermal annealing, to cause solid-state diffusion of dopants, such as phosphorus dopants, from the first doping layer 14 into the first end portion 28a, and from the second doping layer 18 into the second end portion 28b, to form drain and source regions 44 and 46, respectively. It will be understood that some dopants from the drain contact 12 and/or from the source contact 38 also may diffuse, to form the drain and source (or drain and source extension) regions 44 and 46, respectively, which may be beneficial to form low resistance source/drain extensions.

It also will be understood that the annealing may take place during earlier steps, for example during the steps shown in FIGS. 1H, 1I and/or 1J. Annealing preferably is performed prior to forming the insulated gate electrode, so that the relatively high temperature annealing need not impact the formation of a gate insulating layer and/or gate electrode. Thus, advanced gate stack materials may be used, since the solid-state diffusion may be performed before forming the gate stack. However, the annealing can also be performed during any later steps, if desired.

Referring now to FIG. 1L, the intermediate layer 16 is removed, for example using a wet etching process, to expose at least some of the middle portion 28c of the silicon layer 28. Then, as shown in FIG. 1M, a gate insulating layer, such as a gate oxide 48 then may be formed, for example by thermally oxidizing the exposed middle portion 28c of the silicon layer 28. Optionally, a thermal oxide may be formed, and the thermal gate oxide may be removed, followed by a second thermal oxidation, to allow improved quality gate oxides to be formed. Moreover, a gate oxide may be performed using one or more depositions. In other embodiments, high dielectric constant materials such as ferroelectric materials also can be used. The formation of these materials is well known to those having skill in the art, and need not be described further herein.

Still referring to FIG. 1M, a gate electrode 52 then may be formed, for example using chemical vapor deposition. The gate electrode 52 can comprise polysilicon and/or metal and/or other conducting materials. Multiple gate electrodes also may be formed. Then, as shown in FIG. 1N, the gate electrode 52 is patterned.

The steps of removing the intermediate layer 16, forming the gate oxide 48 and forming a gate electrode 52 may be referred to as a "replacement gate" technique, and are described, for example in the above-cited Hergenrother et al. publication.

Potential advantages of methods of fabricating vertical field effect transistors according to embodiments of the invention now will be described. In particular, in FIG. 1D, the silicon layer 28 that eventually forms the source 46, drain 44 and channel 50 of FIG. 1K may be formed by depositing a conformal layer of silicon 28 on the sidewall 26 of a trench 24. Since the silicon channel is deposited by a conformal process, the channel thickness need not depend on lithography, and can be precisely controlled. This sharply contrasts with vertical field effect transistor fabrication processes that are described, for example, in the above-cited Hergenrother et al. publication, wherein the silicon channel is formed in a trench using epitaxial silicon growth. In the epitaxial deposition, the thickness of the silicon channel was determined by the width of the trench, which in turn was defined by photolithography. Accordingly, it may be difficult to scale vertical field effect transistors that are described in the above-cited Hergenrother et al. publication, to and below 35 nm gate length.

Moreover, as was described in connection with FIG. 1F, CVD $SiO_2$ may be used as the back oxide, and this vertical device may behave like a fully depleted SOI MOSFET. However, if the trench is sufficiently narrow, the front and back gates may start to couple with each other. The coupling of the front and back gates can be enhanced, according to other embodiments of the invention, by replacing the back oxide with a high-k dielectric. If high-k dielectrics with extremely high k values (such as $SrTiO_3$ and/or $BaSrTiO_3$) are integrated into this device structure, this vertical device may behave very much like a double gate MOSFET. Moreover, the requirements on this high-k back dielectric may be less stringent than those on gate dielectrics.

As also was described in FIGS. 1K–1N, a replacement gate process may be used, so that the gate length may be defined by the thickness of the intermediate layer 16, rather than by lithography. The chemical vapor deposition process may be precisely controlled to provide an intermediate layer 16 of a desired thickness. Accordingly, in some embodiments of the invention, both the gate length and channel thickness can be free of lithography constraints.

Embodiments of the present invention also may provide high drive currents. In particular, referring again to FIG. 1D, a conformal layer of silicon 28 may be a continuous conformal silicon layer 28 that is formed on the entire sidewall 26, so that a closed cylindrical or polyhedral shape may be provided. The relatively large channel thereby may provide high drive currents. Moreover, the conformal silicon layer may be formed on spaced apart portions of the trench sidewall, for example on the left and right sides of the trench 24 of FIG. 1D, to provide two or more spaced apart conformal amorphous silicon plates, and thereby provide two or more conducting channels for each trench 24. This can greatly increase the drive current of a transistor compared to a horizontal configuration. In these embodiments, it also will be understood that the drain contacts 12, the source contact 38 and/or the gate electrode 52 may be patterned to provide two or more separate sources, drains and/or gates, to provide two or more field effect transistors in the trench 24. Common source, drain and/or gate embodiments also may be provided.

As also shown in FIG. 1K, self-aligned source and drain regions 46 and 44, respectively, may be provided. Well-controlled offset spacers and source/drain extensions may be provided using depositions, to thereby allow high performance devices to be fabricated.

Finally, all of the fabrication steps that are illustrated in FIGS. 1A–1N can be embodied by mature technologies, except perhaps for the solid-state crystallization of the ultra-thin silicon film in FIG. 1D. Fortunately, solid-state crystallization of silicon has been well studied, and currently is in widespread use, for example in flat panel display technology for fabricating thin film transistors.

It has been recognized that difficulty in obtaining single crystal silicon thin films may increase when a silicon grain is far away from a seed location. However, this difficulty may not be encountered in embodiments of the present invention, because the thin silicon channel 50 is short and within close proximity of a single crystal seed source, for example the substrate 10. For example, for a gate length of 35 nm, the total vertical silicon channel 50 may be shorter than 100 nm, and the crystallization of an amorphous silicon film 28 over such a small distance from a seed can be performed relatively easily compared to horizontal configurations. Solid-state crystallization also can be induced with single crystal metal silicide seeds. Thus, epitaxially-grown metal silicide, such as nickel silicide may be used as the drain contact 12, to allow the performance of the transistor to be enhanced further.

Figure 2:
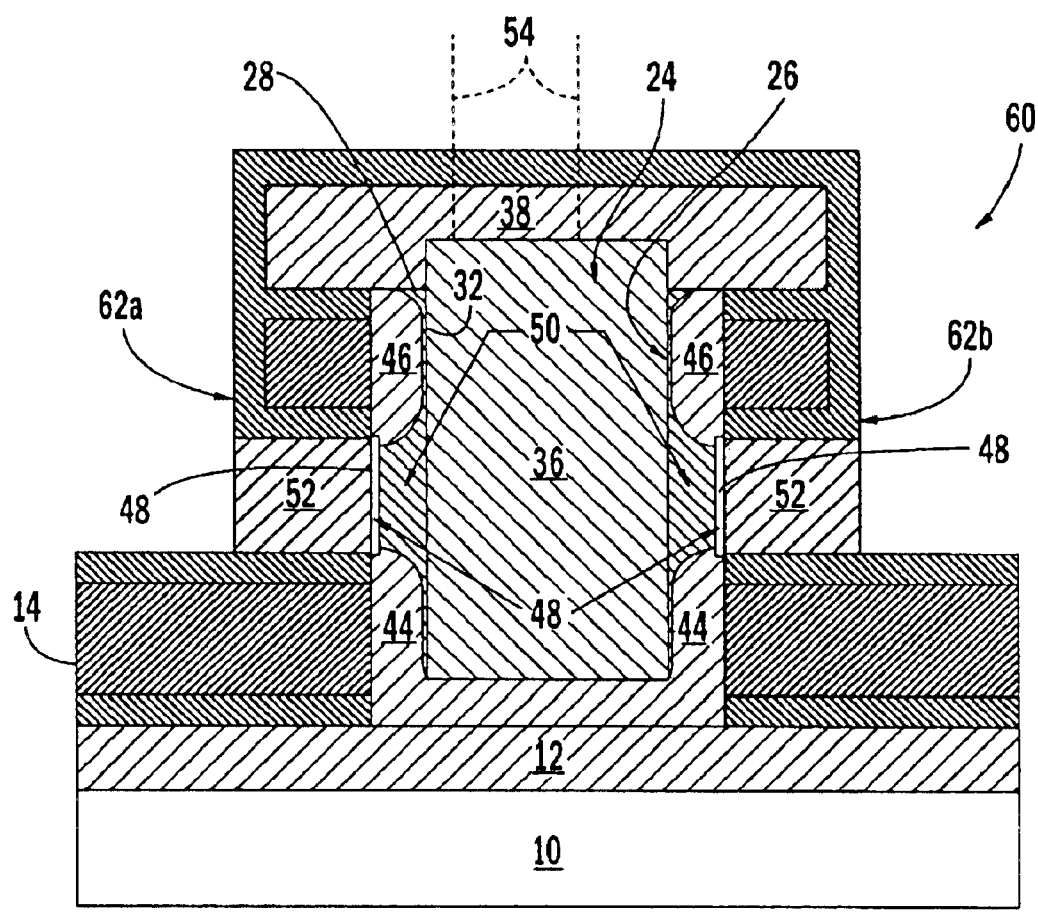
FIG. 2 is cross-sectional view of vertical field effect transistors according to embodiments of the present invention.

Referring now to FIG. 2, a cross-sectional view of vertical field effect transistors according to embodiments of the present invention is shown. As shown in FIG. 2, these vertical field effect transistors 60 include a microelectronic substrate 10 including a trench 24 that defines a sidewall 26. A conformal monocrystalline silicon layer 28 is on the sidewall 26 of the trench 24, and includes a drain region 44 adjacent the substrate, a source region 46 remote from the substrate, and a channel region 50 between the source and drain regions 46 and 44. A plug 36, preferably an insulating plug, is in the trench that includes a conformal monocrystalline silicon layer 28 on the sidewall 26 thereof. A gate insulating layer 48 is adjacent the channel, and a gate electrode 52 is on the gate insulating layer 48 opposite the channel 50. In some embodiments, the conformal monocrystalline silicon layer 28 on the sidewall 26 of the trench 24 is a continuous conformal monocrystalline silicon layer. In these embodiments, a single drain contact 12, a single gate electrode 52 and a single source contact 38 are provided, as shown in FIG. 2. However, in other embodiments, the conformal monocrystalline silicon layer on the sidewall of the trench comprises two or more spaced apart conformal portions on the sidewall of the trench. Stated differently, only the portions of conformal monocrystalline silicon layer 28 shown in FIG. 2 may be present, and there may be no conformal monocrystalline silicon layer formed within the plane of FIG. 2. In these embodiments, two or more separate field effect transistors 62a and 62b may be formed, that may be operated in parallel using a common drain contact 12, a common source contact 38, and/or a common gate 52. Alternatively, a portion of the source contact between lines 54 may be removed to form two or more discrete source contacts, and the gates of FIG. 2 need not be electrically connected together, so that two or more common drain field effect transistors may be formed in the small area on substrate 10. Moreover, selective deposition and/or epitaxy techniques may be used to form two or more separate drain contact regions, as was described above.

Accordingly, vertical field effect transistors and fabrication methods therefor according to embodiments of the invention can scale fabrication technologies to and below 35 nm dimensions, without the need to overcome major technological barriers. Since the channel thickness, and preferably the gate length, can be defined with thin film deposition, they can be independent of lithography. Moreover, since conventional fabrication processes may be used, potentially low-cost fabrication can result. The vertical configuration also can offer high density functionality and a double or more channel embodiment can be used for high performance applications. Moreover, the replacement gate fabrication scheme can be compatible with alternative gate stacks, such as high dielectric constants and/or metal gate electrodes, which may be desirable for CMOS technologies at 35 nm and beyond.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A vertical field effect transistor comprising:
    a microelectronic substrate including a trench, the trench defining a sidewall;
    a conformal monocrystalline silicon layer on the sidewall of the trench, the conformal monocrystalline silicon layer on the sidewall of the trench including a drain region adjacent the substrate, a source region remote from the substrate and a channel region between the source and drain regions;
    a plug comprising insulating material in the trench that includes the conformal monocrystalline silicon layer on the sidewall thereof;
    a gate insulating layer adjacent the channel; and
    a gate electrode on the gate insulating layer opposite the channel.

2. A field effect transistor according to claim 1 wherein the conformal monocrystalline silicon layer on the sidewall of the trench is a continuous conformal monocrystalline silicon layer on the sidewall of the trench.

3. A field effect transistor according to claim 1 wherein the conformal monocrystalline silicon layer on the sidewall of the trench comprises spaced apart conformal portions of the conformal monocrystalline silicon layer on the sidewall of the trench.

4. A field effect transistor according to claim 1 further comprising:
    a first layer on the substrate; and
    a second layer on the first layer opposite the substrate;
    wherein the trench extends in the first layer and the second layer; and
    wherein the gate insulating layer and the gate electrode are between the first and second layers.

5. A field effect transistor according to claim 4 wherein the first and second layers comprise phosphosilicate glass and/or borosilicate glass.

6. A field effect transistor according to claim 1 wherein the plug comprises high dielectric constant insulating material.

7. A field effect transistor according to claim 1 further comprising a silicon layer between the microelectronic substrate and the drain region.

* * * * *